(12) United States Patent
Yamamoto et al.

(10) Patent No.: US 7,060,154 B2
(45) Date of Patent: Jun. 13, 2006

(54) METHOD AND APPARATUS FOR REMOVING UNWANTED SUBSTANCE FROM SEMICONDUCTOR WAFER

(75) Inventors: Masayuki Yamamoto, Osaka (JP); Minoru Ametani, Osaka (JP)

(73) Assignee: Nitto Denko Corporation, Osaka (JP)

( * ) Notice: Subject to any disclaimer, the term of this patent is extended or adjusted under 35 U.S.C. 154(b) by 503 days.

(21) Appl. No.: 10/258,792

(22) PCT Filed: Jul. 30, 2001

(86) PCT No.: PCT/JP01/06556

§ 371 (c)(1),
(2), (4) Date: Oct. 28, 2002

(87) PCT Pub. No.: WO02/13236

PCT Pub. Date: Feb. 14, 2002

(65) Prior Publication Data

US 2003/0092288 A1    May 15, 2003

(30) Foreign Application Priority Data

Aug. 7, 2000  (JP) ............................. 2000-238599
Jun. 11, 2001  (JP) ............................. 2001-175812

(51) Int. Cl.
    *B32B 31/00*    (2006.01)
(52) U.S. Cl. ...................................... 156/267; 156/510
(58) Field of Classification Search ............... 438/689, 438/758; 118/35; 156/379.8, 540, 267, 156/510, 247
    See application file for complete search history.

(56) References Cited

U.S. PATENT DOCUMENTS

| 4,631,110 A | 12/1986 | Tsumura et al. |
| 4,775,438 A | 10/1988 | Funakoshi et al. |
| 5,891,298 A * | 4/1999 | Kuroda et al. ............... 156/344 |
| 5,911,850 A | 6/1999 | Zung |
| 6,100,166 A * | 8/2000 | Sakaguchi et al. ........... 438/455 |
| 6,159,827 A * | 12/2000 | Kataoka et al. ............. 438/464 |
| 6,238,515 B1 * | 5/2001 | Tsujimoto et al. ........ 156/379.8 |
| 6,534,382 B1 * | 3/2003 | Sakaguchi et al. .......... 438/455 |
| 2005/0081988 A1 * | 4/2005 | Yamamoto ................... 156/267 |

FOREIGN PATENT DOCUMENTS

| EP | 0 901 154 A2 | 3/1999 |
| EP | 1 128 415 A2 | 8/2001 |
| JP | 11-045934 B1 | 2/1999 |
| JP | 2000-335816 B1 | 5/2000 |

OTHER PUBLICATIONS

International Search Report of PCT/JP01/06556 mailed May 16, 2002.

* cited by examiner

*Primary Examiner*—Walter L. Lindsay, Jr.
(74) *Attorney, Agent, or Firm*—Rader, Fishman & Grauer PLLC

(57) ABSTRACT

An apparatus for removing an unwanted substance from a semiconductor wafer, according to this invention, applies a peeling tape T to a protective tape P on the surface of the semiconductor wafer W. An edge member 28 is placed in contact with the surface of the peeling tape T and run along the protective tape P. The peeling tape T is peeled as being folded back by a large angle of 90 degrees or more at the tip of edge member 28. The protective tape P is peeled and removed along with the peeling tape T from the surface of the wafer. As a result, the unwanted substance is removed with high precision without breaking the wafer W.

10 Claims, 21 Drawing Sheets

METHOD AND APPARATUS FOR REMOVING UNWANTED SUBSTANCE FROM SEMICONDUCTOR WAFER

TECHNICAL FIELD

This invention relates to a method and an apparatus using this method for removing an unwanted substance such as a protective tape, resist layer or the like present on a surface of a semiconductor wafer (hereinafter called wafer for short) by using a peeling tape.

BACKGROUND ART

Conventionally, when grinding the back of a wafer (back grinding) after a pattern forming process, a broad protective tape is first applied the surface of the wafer, parts of the protective tape protruding from outer peripheries of the wafer are cut off along the wafer peripheries, and a grinding process is carried out for the wafer, with the entire surface thereof protected by the protective tape, and suction-supported at the surface thereof by a suction cup. Thereafter, the protective tape, which is now an unwanted substance, is peeled and removed from the surface of the wafer.

A removing method using a peeling tape exists as means for peeling off the protective tape, and its outline is shown in FIG. 30. In this removing method, a peeling tape T with a stronger adhesion than a protective tape P is applied to the protective tape (unwanted substance) P adhering to the surface of wafer W. The peeling tape T is wound up while a peeling roller 40 is rolled over the wafer to run rightward in FIG. 30, whereby the protective tape P is peeled together with the peeling tape T as shown in phantom lines in FIG. 30.

In this case, the peeling tape T is wound with the curvature of the peeling roller 40. At a point where the protective tape P peel from the surface of wafer W, the peeling angle of the protective tape P to the surface of the wafer is a small angle close to zero, and a peeling force acts in a direction approximately perpendicular to the wafer W. As a result, where the wafer W is thin and weak, as shown in FIG. 31, the wafer could break at a point A.

Further, as shown in FIG. 32, a wafer W with beveling b formed by obliquely cutting off outer peripheries may be back-ground to a large extent reaching a level G of the beveling b. With this thin wafer W, as shown in FIG. 33, a protruding end Pa of protective tape P could droop and stick to the beveling b. In such a condition, it would be difficult to start peeling the protective tape P at that end. When the peeling tape T is wound up with the peeling roller 40 rolled along in this state, the wafer W could break with greater ease.

The above phenomenon in which the wafer is broken by a tape peeling force applied when the peeling tape is peeled occurs also when peeling the peeling tape applied directly to the surface of the wafer in order to remove, with the peeling tape, resist layer (unwanted substance) remaining on the surface of the wafer.

This invention has been made having regard to the state of the art noted above, and its object is to provide a removing method and apparatus for peeling and removing unwanted substances from wafers by using a peeling tape while avoiding the wafer being broken by a tape peeling force.

DISCLOSURE OF THE INVENTION

This invention provides a method of removing an unwanted substance from a semiconductor wafer by applying a peeling tape to the semiconductor wafer and peeling the unwanted substance along with the peeling tape from the semiconductor wafer, characterized in that an edge member is placed in contact with a surface of the peeling tape applied to the semiconductor wafer, and the peeling tape is peeled while being folded back at a peeling angle given by a tip of the edge member.

In the above method, the peeling tape applied to the wafer is folded back at the peeling angle by the tip of the edge member. Thus, the tape peeling angle to the surface of the wafer is much larger than where a peeling roller is used. The peeling tape may therefore be peeled without applying a strong peeling force to the wafer. The unwanted substance may be peeled and removed along with the peeling tape from the surface of even a thin wafer without breaking the latter.

In the method of removing an unwanted substance according to this invention, the peeling angle given to the peeling tape by the tip of the edge member, preferably, is an acute angle or an obtuse angle. It is further preferable that the acute angle is at least 90 degrees and the obtuse angle is less than 90 degrees.

It is also preferred that a height of the tip of the edge member is stabilized.

That is, the height of the tip of the edge member is maintained constant. The tip of the edge member is maintained at a constant height from beginning to end of the movement.

In the method of removing an unwanted substance according to this invention, the tip of the edge member, preferably, is reciprocated through a small stroke at an end of the wafer.

The peeling tape may be peeled and removed from the wafer with high efficiency by reciprocating the edge member peeling the peeling tape and reaching the end of the wafer.

In the method of removing an unwanted substance according to this invention, the unwanted substance on the semiconductor wafer, preferably, is a protective tape applied to the surface of the wafer or a resist layer formed on the surface of the wafer.

This invention provides also an apparatus for removing an unwanted substance from a semiconductor wafer, comprising a peeling table for supporting the semiconductor wafer; a tape server for supplying a peeling tape to the semiconductor wafer on the peeling table; a tape applicator unit for receiving the peeling tape and applying the peeling tape to the semiconductor wafer; a tape peeling unit having an edge member for peeling the peeling tape from the semiconductor wafer, starting at an end of the semiconductor wafer, by folding back the peeling tape at a peeling angle given by the tip of the edge member to the peeling tape; and a tape collector for collecting the peeling tape peeled along with the unwanted substance from the wafer.

In the above apparatus, operations may be performed on the peeling table in series to apply the peeling tape to the wafer and to peel the peeling tape by using the edge member to give a large peeling angle. The peeling tape may also be supplied and collected after use in a series of steps. Thus, the unwanted substance may be removed from the surface of the wafer efficiently, and hence numerous wafers may be processed successively.

The apparatus for removing an unwanted substance according to this invention, preferably, includes a device for adjusting an angle of the edge member to the surface of the wafer, or a holding device for preventing the tip of the edge member from falling when the tip of the edge member peeling the peeling tape from the wafer moves beyond a terminal end of the wafer.

With the device for adjusting the angle of the edge member, the tape may be peeled at an appropriate folding angle. With the holding device, the height of the tip of the edge member is maintained constant, and thus the tip of the edge member is maintained at a constant height from beginning to end of the movement.

In the apparatus for removing an unwanted substance according to this invention, the tape peeling unit, preferably, includes an edge unit having an edge member attached thereto, and supported to be swingable back and forth in a direction of movement of the tape peeling unit; an angle adjusting device for adjusting an angle of the edge member to the surface of the wafer; and a holding device for preventing the tip of the edge member from falling when the tip of the edge member peeling the peeling tape from the wafer moves beyond a terminal end of the wafer; the angle adjusting device having a member for swinging the edge unit to adjust an angle of the tip of the edge member; and the holding device having a member for restricting vertical movement of the tip of the edge member occurring with swinging of the edge unit.

The edge unit is supported to be swingable back and forth in the direction of movement of the tape peeling unit. This edge unit is swingable by the angle adjusting device, thereby setting or varying an angle and height of the edge member with ease.

The holding device restricts vertical movement of the tip of the edge member occurring with swinging of the edge unit. This prevents the tip of the edge member from falling when the tip of the edge member peeling the peeling tape moves beyond an end of the wafer. That is, the peeling tape is prevented from adhering directly to the wafer.

In the apparatus for removing an unwanted substance according to this invention, the peeling angle given to the peeling tape by the tip of the edge member, preferably, is an acute angle or an obtuse angle. It is further preferable that the acute angle is at least 90 degrees and the obtuse angle is less than 90 degrees.

In the apparatus for removing an unwanted substance according to this invention, the holding device, preferably, comprises micrometers.

The apparatus for removing an unwanted substance according to this invention may include a device for reciprocating the tip of the edge member through a small stroke at the end of the wafer.

The tip of the edge member peeling the peeling tape and reaching the end of the wafer is reciprocated through a small stroke. As a result, the peeling tape may be peeled and removed from the wafer with high efficiency.

BEST MODE FOR CARRYING OUT THE INVENTION

The following forms are cited for solving the problems of the prior art:

<First Embodiment>

Figure 1:
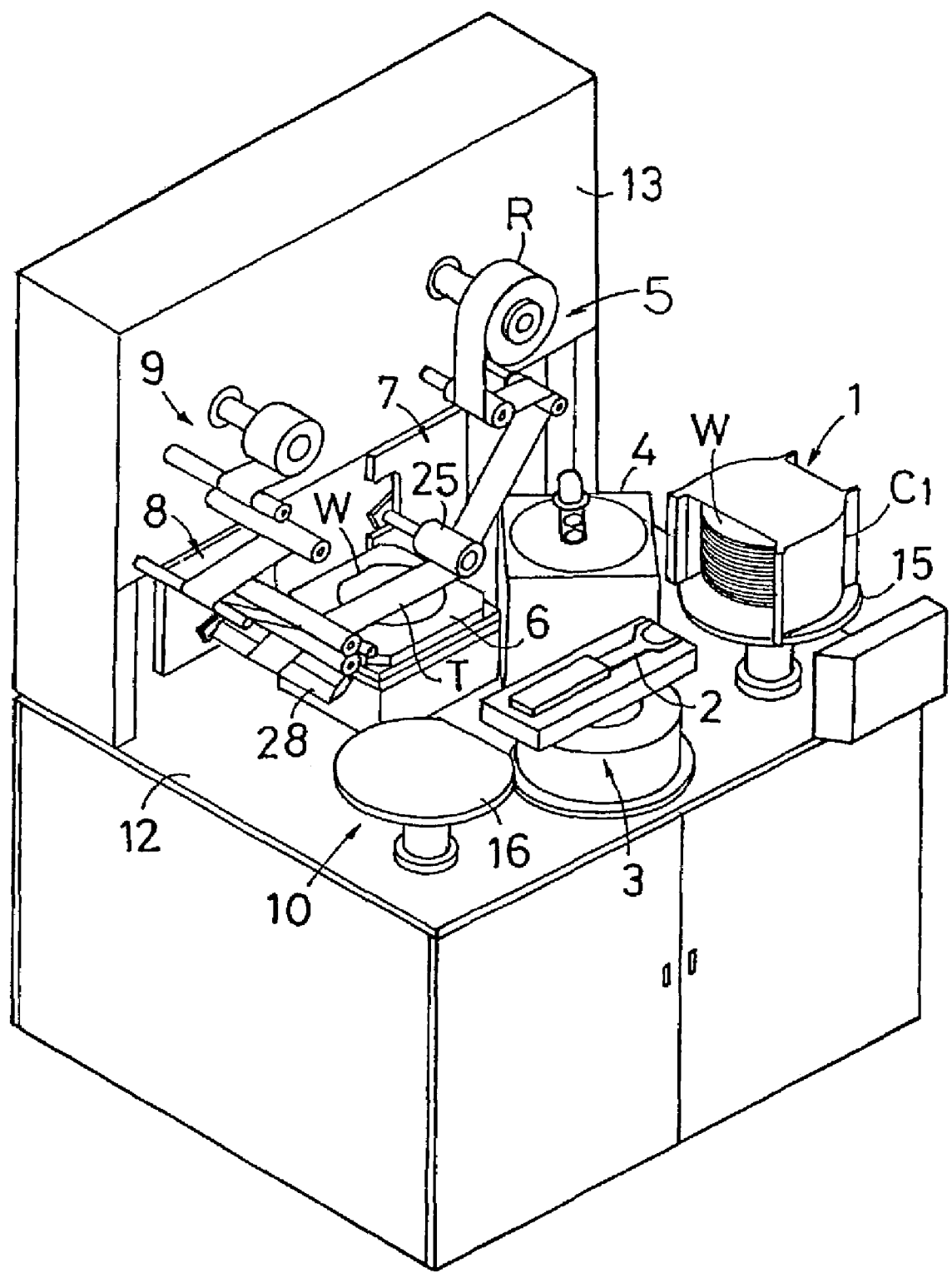
FIG. 1 is a perspective view showing an entire protective tape peeling apparatus in a first embodiment.
Figure 2:
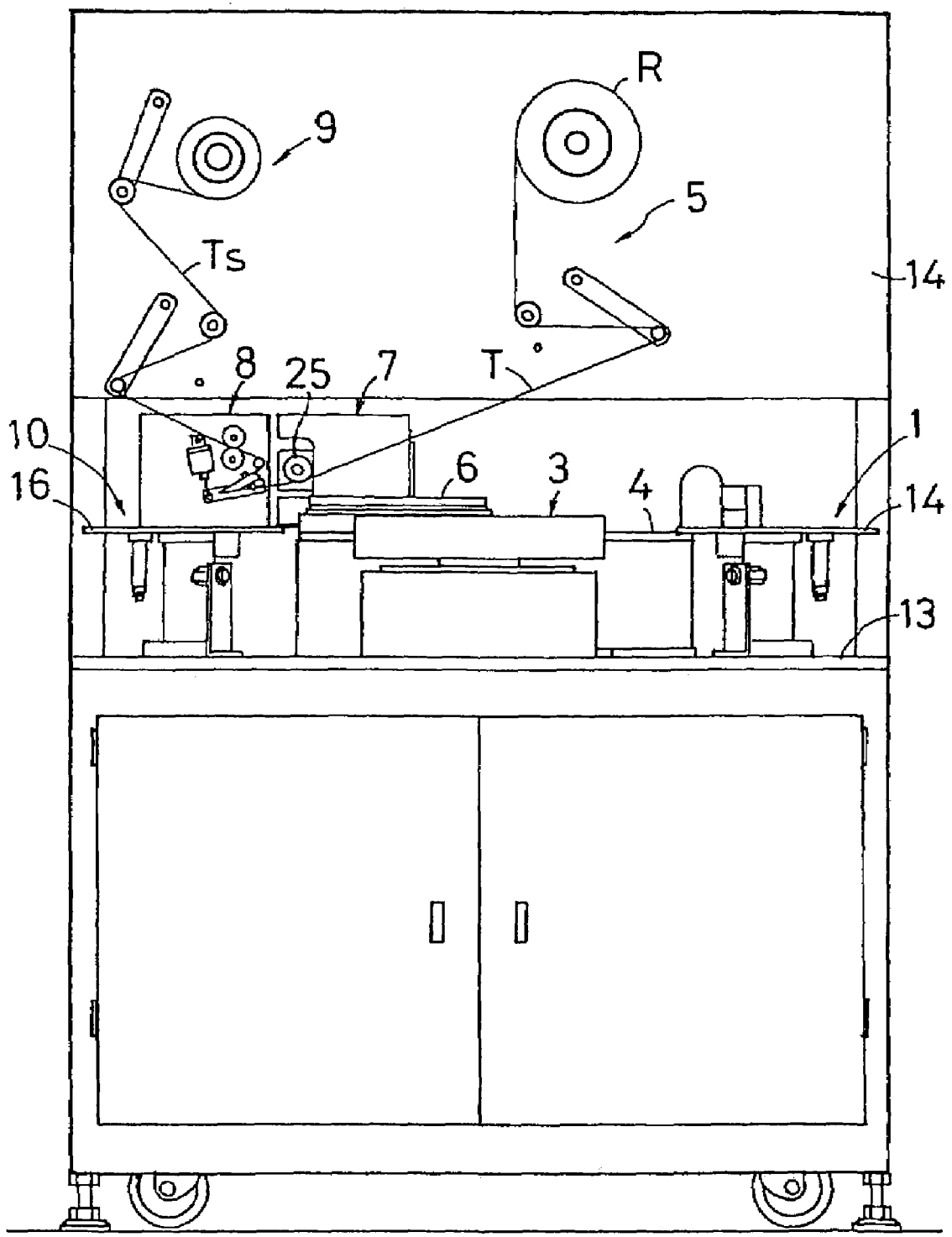
FIG. 2 is a front view of the entire protective tape peeling apparatus in the first embodiment.
Figure 3:
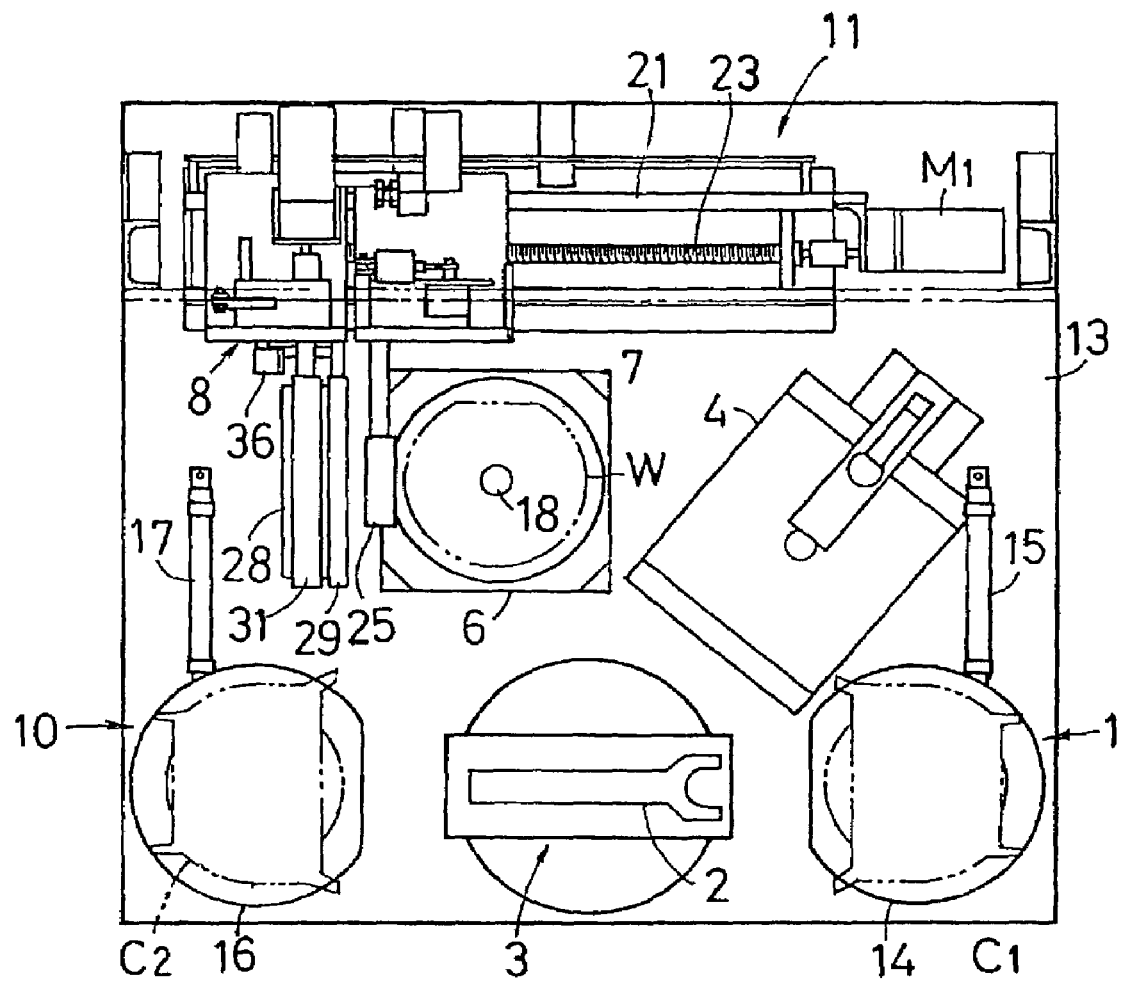
FIG. 3 is a plan view of the entire protective tape peeling apparatus in the first embodiment.
Figure 4:
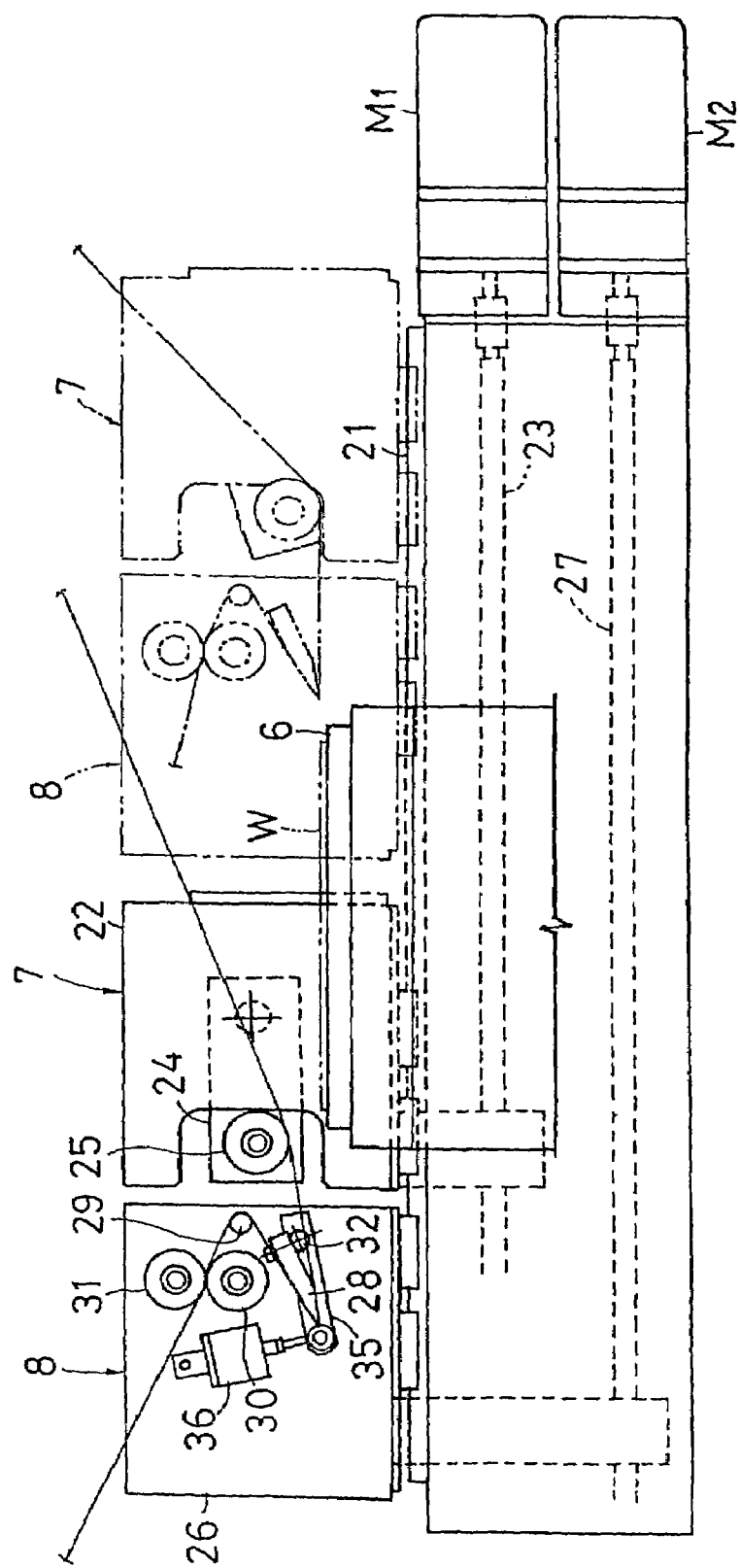
FIG. 4 is a front view of a tape applicator unit and a tape peeling unit.
Figure 5:
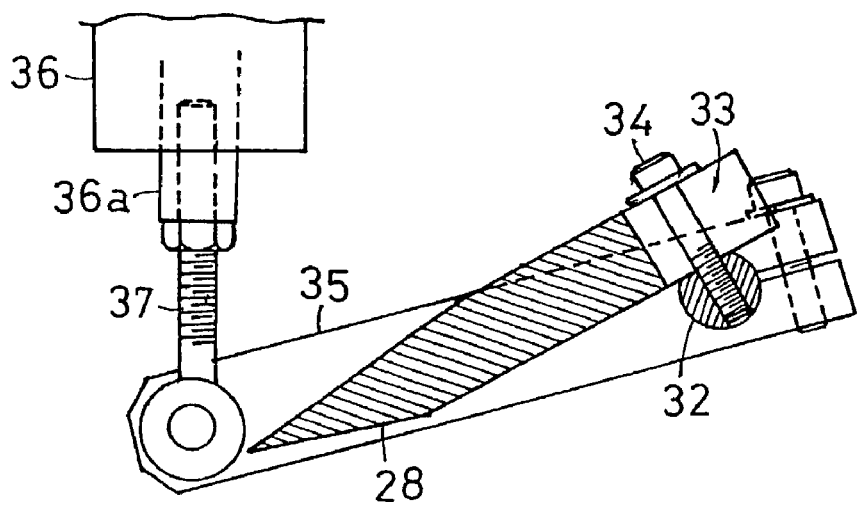
FIG. 5 is a front view showing a support structure for a tape peeling edge member.
Figure 6:
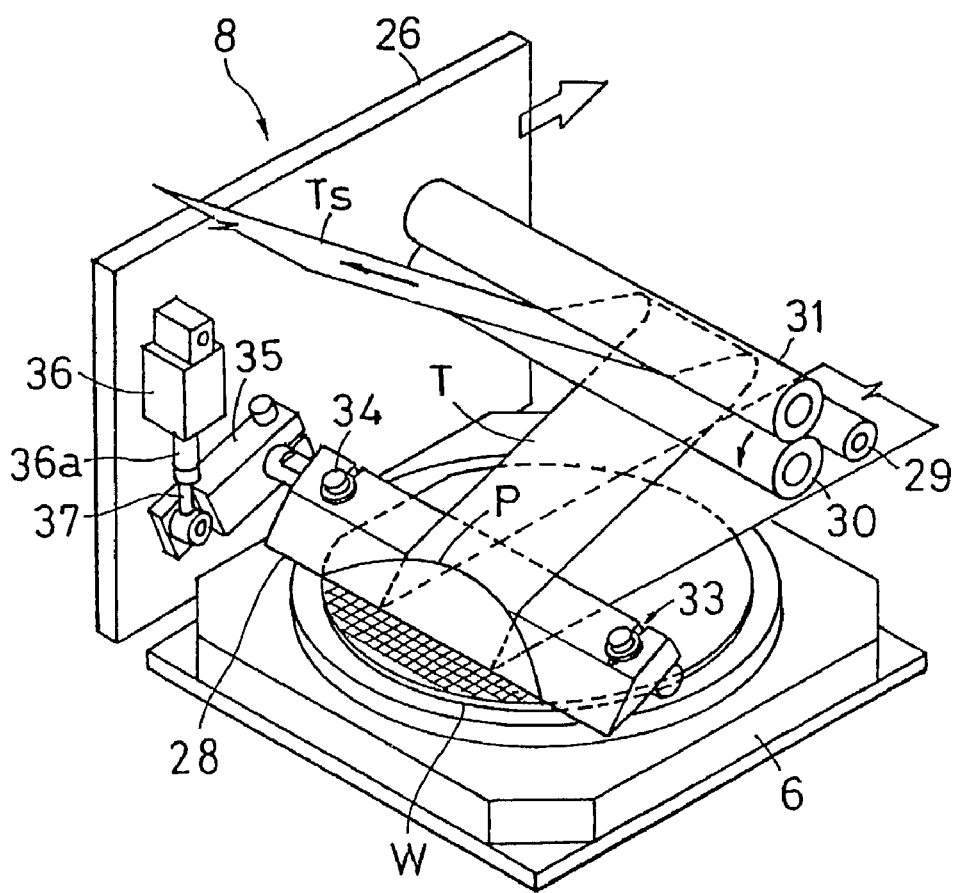
FIG. 6 is a perspective view of a principal portion showing a tape peeling operation.

A first embodiment which is one form of implementing this invention will be described hereinafter with reference to the drawings. FIG. 1 is a perspective view showing an entire protective tape peeling apparatus which is one example of unwanted substance removing apparatus according to this invention. FIG. 2 is a front view and FIG. 3 is a plan view thereof. FIG. 4 is a front view of a tape applicator unit and a tape-peeling unit. FIG. 5 is a front view showing a support structure for a tape peeling edge member. FIG. 6 is a perspective view of a principal portion showing a tape peeling operation.

This wafer's protective tape removing apparatus includes a wafer supplying station 1 for receiving a cassette C1 containing wafers W stacked therein, a wafer transport mechanism 3 having a robot arm 2, an alignment stage 4 for adjusting positions of wafers W, a tape server 5 for supplying a peeling tape T to a peeling position, a peeling table 6 for suction-supporting a wafer W, a tape applicator unit 7 for applying the peeling tape T to the wafer W on the peeling table 6, a tape peeling unit 8 for peeling the peeling tape T applied, a tape collector 9 for taking up and collecting peeling tape Ts peeled, a wafer collecting station 10 for receiving a cassette C2 for storing processed wafers W as stacked therein, and a unit driver 11 for reciprocating the tape applicator unit 7 and tape peeling unit 8 right and left independently of each other. These components are arranged on or above a base 12. The wafer supplying station 1, wafer transport mechanism 3, alignment stage 4, peeling table 6 and wafer collecting station 10 are arranged on an upper surface of base 12, while the tape server 5 and tape collector 9 are mounted on a front surface of a vertical wall 13 erected on the upper surface of base 12. The tape applicator unit 7 and tape peeling unit 8 are arranged adjacent a lower opening of vertical wall 13, and the unit driver 11 is disposed rearwardly of vertical wall 13.

The wafer supplying station 1 includes a cassette table 14 for receiving the cassette C1 containing wafers W stacked in horizontal posture at suitable vertical intervals, with the surfaces having protective tape P applied thereto facing upward. The cassette table 14 is rotatable by an air cylinder 15 to change its direction. The wafer collecting station 10 also includes a cassette table 16 for supporting the cassette C2 that receives wafers W after the protective tape has been peeled therefrom, as stacked in horizontal posture at suitable vertical intervals. This cassette table 16 also is rotatable by an air cylinder 17 to change its direction.

The robot arm 2 of transport mechanism 3 is horizontally movable and pivotable to take each wafer W from the wafer supplying station 1, supply the wafer W to the alignment stage 4, transfer the wafer W from the alignment stage 4 to the peeling table 6, remove each processed wafer W from the peeling table 6, and load the processed wafer W into the wafer collecting station 10.

The tape server 5 draws the peeling tape T from a stock roll R, and guides it over the peeling table 6 to the tape applicator unit 7 and tape-peeling unit 8. The peeling tape T used herein has a width smaller than the diameter of wafer W.

As shown in FIG. 3, the peeling table 6 includes a suction pad 18 mounted centrally thereof to be vertically movable, and having an upper surface acting as a vacuum suction surface. The peeling table 6 has an upper, vacuum suction surface for supporting the wafer W free from displacement.

As shown in FIG. 4, the tape applicator unit 7 includes a movable frame 22 supported to be movable right and left along rails 21. The movable frame 22 is reciprocable right and left through a fixed stroke by a feed screw 23 reversibly driven by a motor M1. The movable frame 22 has an applicator roller 25 vertically movably supported through swing arms 24.

The tape-peeling unit 8 also includes a movable frame 26 supported to be movable right and left along the rails 21. The movable frame 26 is reciprocable right and left through a fixed stroke by a feed screw 27 reversibly driven by a motor M2. This movable frame 26 has a tape peeling edge member 28, a guide roller 29, a driven discharge roller 30 and a pinch roller 31 opposed thereto.

As shown in FIGS. 5 and 6, the tape peeling edge member 28 is formed of a plate defining a sharp edge at a distal end thereof and having a width greater than the diameter of the wafer. The edge member 28 is fixedly connected to a rotary support shaft 32 supported by and projecting from a front surface of movable frame 26. The edge member 28 is connected through slits 33 and bolts 34 to be adjustable as to its extension and retraction relative to the shaft 32. A control arm 35 is fastened to a proximal end of rotary support shaft 32. The control arm 35 has a free end thereof pivotally connected to a connecting rod 37 which is connected to a piston rod 36a of an air cylinder 36 mounted on the front surface of movable frame 26. The piston rod 36a is extendible and retractable to swing the control arm 35 which in turn rotates the rotary support shaft 32, thereby to move the edge of edge member 28 vertically.

The connecting rod 37 extending from the free end of control arm 35 is screwed into the piston rod 36a of air cylinder 36. By adjusting a length of screw engagement of connecting rod 37, an adjustment may be made of a swing angle of control arm 35 occurring when the piston rod 36a is extended to its stroke end, i.e. an angle of edge member 28 in a lower limit position.

The components of the protective tape peeling apparatus according to this invention are constructed as described above. A basic procedure for peeling the protective tape P from the surface of wafer W will be described hereinafter with reference to FIGS. 7 through 11.

First, the robot arm 2 suction-supports one wafer W, takes it out of the cassette C1 at the wafer supplying station 1, and places the wafer W on the alignment stage 4. Here a positional adjustment is made of the wafer W based on detection of an orientation flat or notch of wafer W. The positionally adjusted wafer W is supported and transported by the robot arm 2 again and supplied to the peeling table 6.

Figure 7:
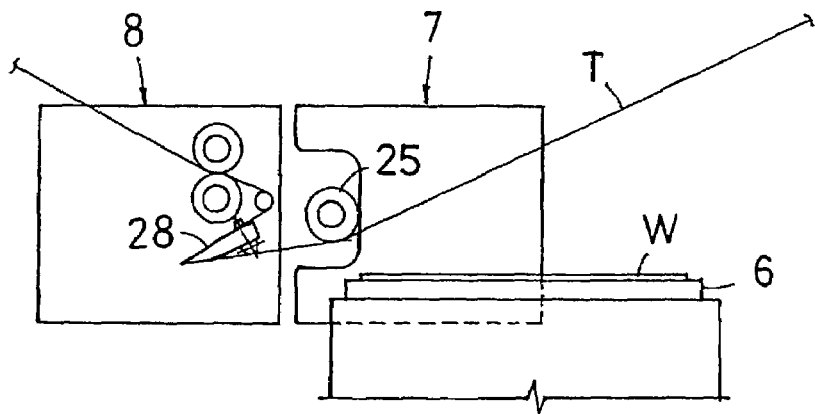
FIG. 7 is a front view illustrating a tape peeling process.

The wafer W placed on the peeling table 6 is received by the suction pad 18 protruding from the table 6. As the suction pad 18 descends, the wafer W is placed in a predetermined posture and position on the upper surface of peeling table 6, and is suction-supported thereon with the surface of wafer W to which the protective tape P is applied facing upward. At this time, as shown in FIG. 7, the tape applicator unit 7 and tape-peeling unit 8 remain in standby positions rearwardly away from the peeling table 6.

Figure 8:
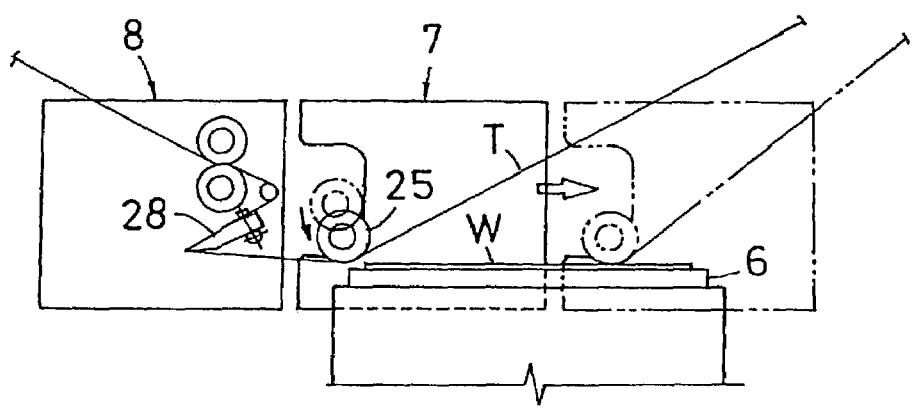
FIG. 8 is a front view illustrating the tape peeling process.

When the wafer W has been loaded on the peeling table 6, as shown in FIG. 8, the applicator roller 25 of tape applicator unit 7 is lowered to a predetermined level. Thereafter the entire unit is moved forward with the applicator roller 25 rolling over the wafer W to apply the peeling tape T to the surface of protective tape P.

Figure 9:
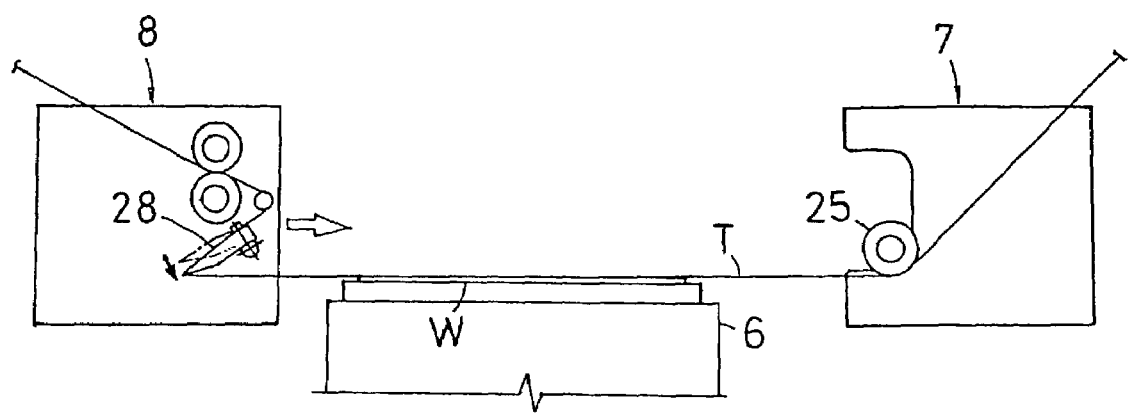
FIG. 9 is a front view illustrating the tape peeling process.

When the peeling tape T has been applied, as shown in FIG. 9, the air cylinder 36 of tape peeling unit 8 is extended to the stroke end to swing the control arm 35, thereby lowering the edge member 28 to the lower limit position.

Figure 10:
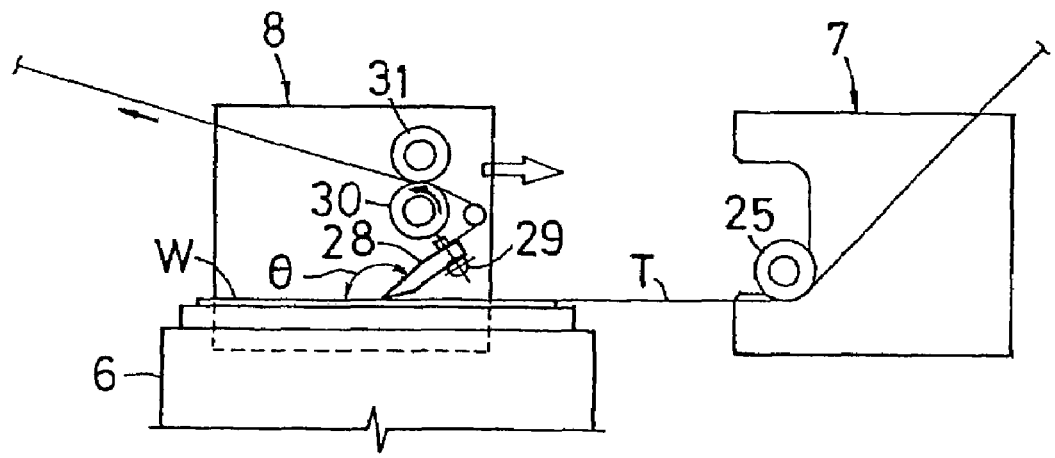
FIG. 10 is a front view illustrating the tape peeling process.

Next, as shown in FIG. 10, the tape-peeling unit 8 is moved forward, with the sharp end of edge member 28 pressing the peeling tape T upon the surface of protective tape P. At the same time, the discharge roller 30 is rotated at a peripheral speed synchronized with a moving speed of the unit to transport the peeling tape T. Thus, the peeling tape T is folded back by an angle θ at the sharp end of edge member 28 and guided through the guide roller 29 to a position between the discharge roller 30 and pinch roller 31. As shown in FIG. 6, the peeling tape T runs with the protective tape P fixedly adhering thereto, thereby peeling the protective tape P from the surface of wafer W.

In this case, the edge member 28 is set to a low forward speed when moving past an end of wafer W to start peeling the protective tape P therefrom. The forward moving speed is thereafter increased for improved processing efficiency. The discharge roller 30 is driven by a driving device not shown, through a slip clutch that slips under a load exceeding a predetermined torque. Thus, the peeling tape T is discharged with a predetermined tension applied thereto.

Figure 11:
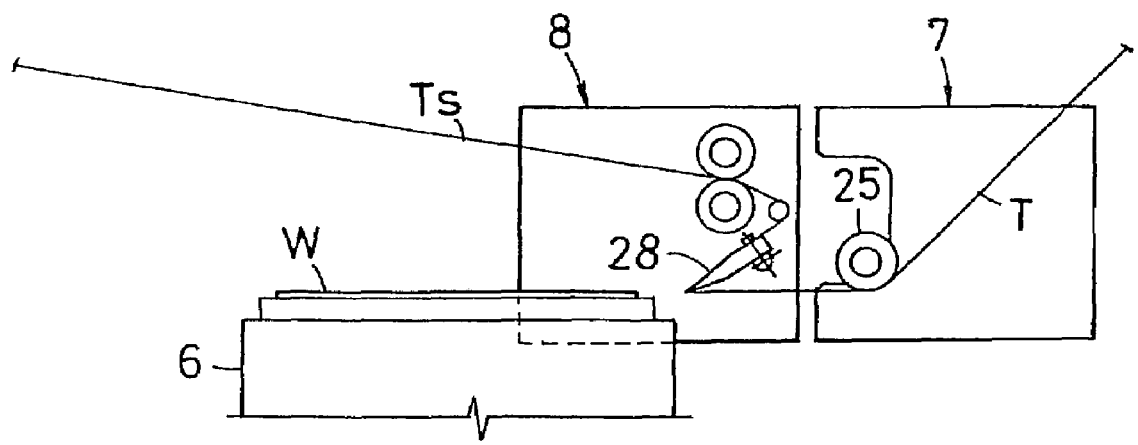
FIG. 11 is a front view illustrating the tape peeling process.

When the tape-peeling unit 8 has moved past the wafer W and peeled the protective tape P completely therefrom, as shown in FIG. 11, the robot arm 2 removes the wafer W from the peeling table 6, and inserts it into the cassette C2 at the wafer collecting station 10. Subsequently, the tape applicator unit 7 and tape-peeling unit 8 are retracted to the initial standby positions, while the used peeling tape Ts is wound up and collected. The applicator roller 25 and edge member 28 also are returned upward to the respective standby positions.

The above completes one tape peeling procedure, and the apparatus stands by to process a next wafer.

Figure 32:
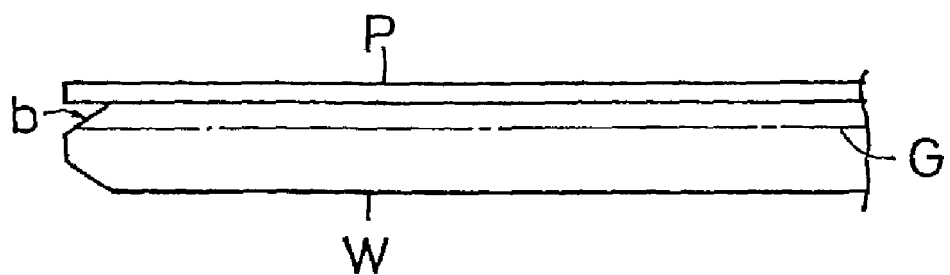
FIG. 32 is a front view showing a portion of a beveled semiconductor wafer with a protective tape applied thereto.
Figure 33:
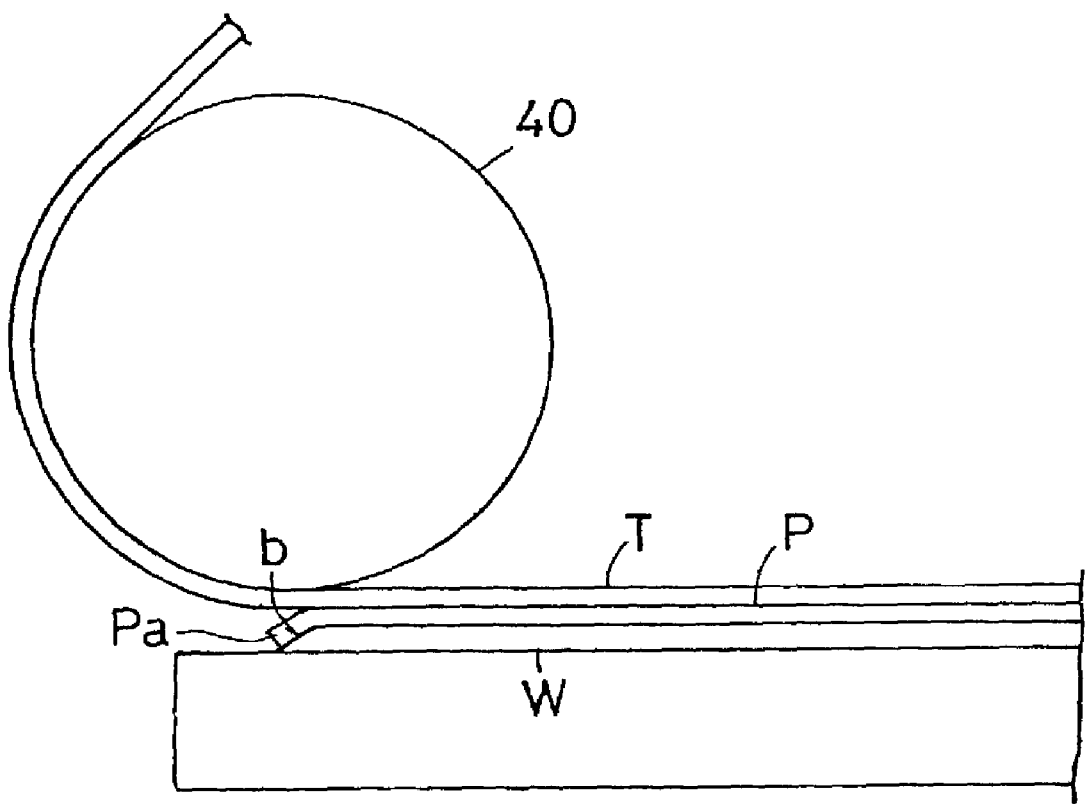
FIG. 33 is an enlarged front view of a principal portion of a process by the conventional device to peel the protective tape from the beveled semiconductor wafer after a back grinding process.

Next, a procedure for peeling the protective tape P from a thin wafer W back-ground to a beveling b (see FIG. 32) will be described with reference to FIGS. 12 through 15.

Figure 12:
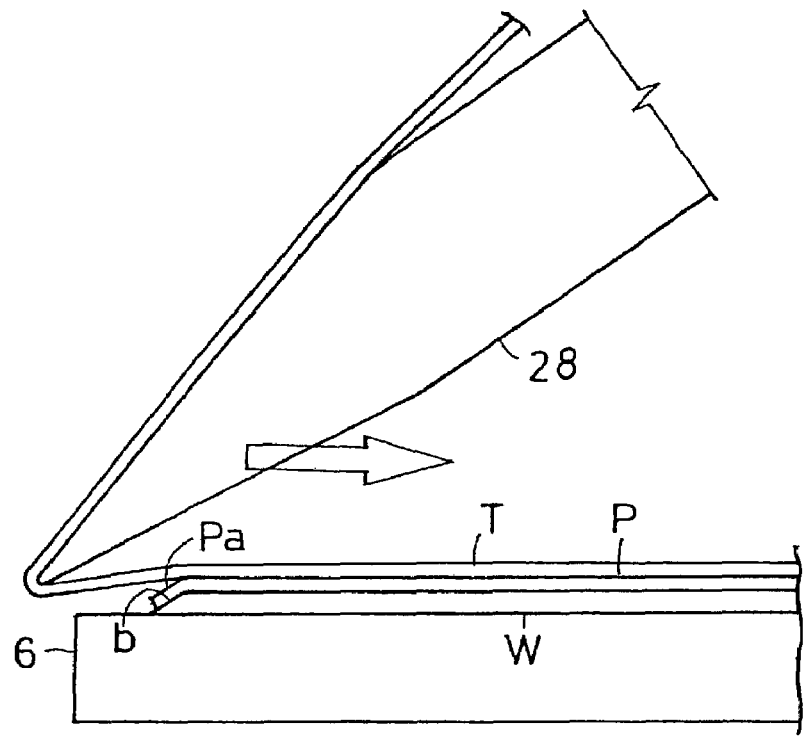
FIG. 12 is an enlarged front view of a principal portion of the tape peeling process.
Figure 13:
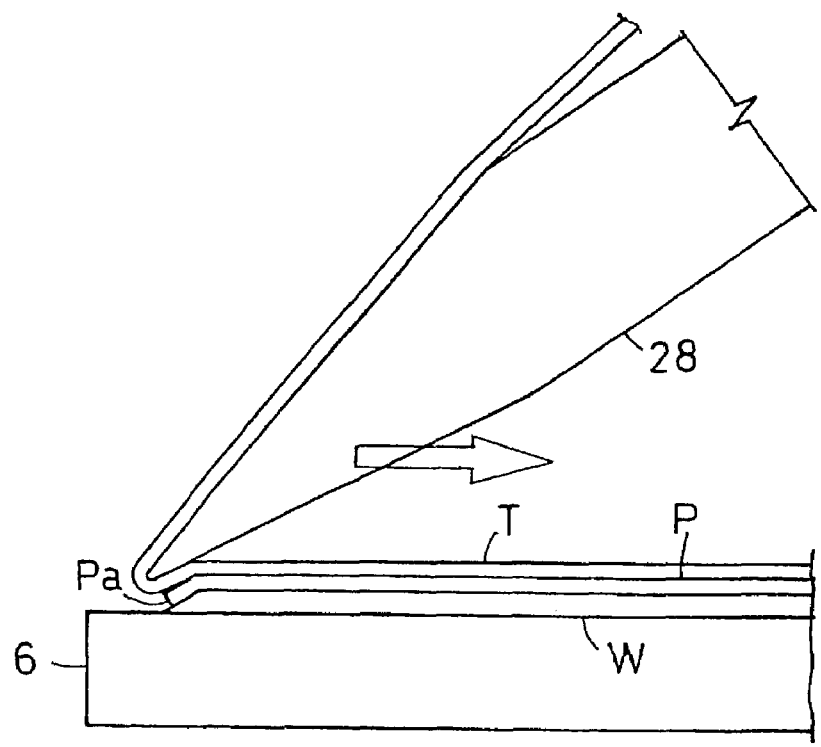
FIG. 13 is an enlarged front view of the principal portion of the tape peeling process.

As shown in FIG. 12, the sharp end of edge member 28 in the lower limit position lies slightly below the surface of protective tape P. Thus, when processing the thin wafer W having the beveling b, with a protruding end Pa of protective tape P adhering to the beveling b, the sharp end of edge member 28 approaching the end of wafer W applies the peeling tape T also to the protruding end Pa of protective tape P.

Figure 14:
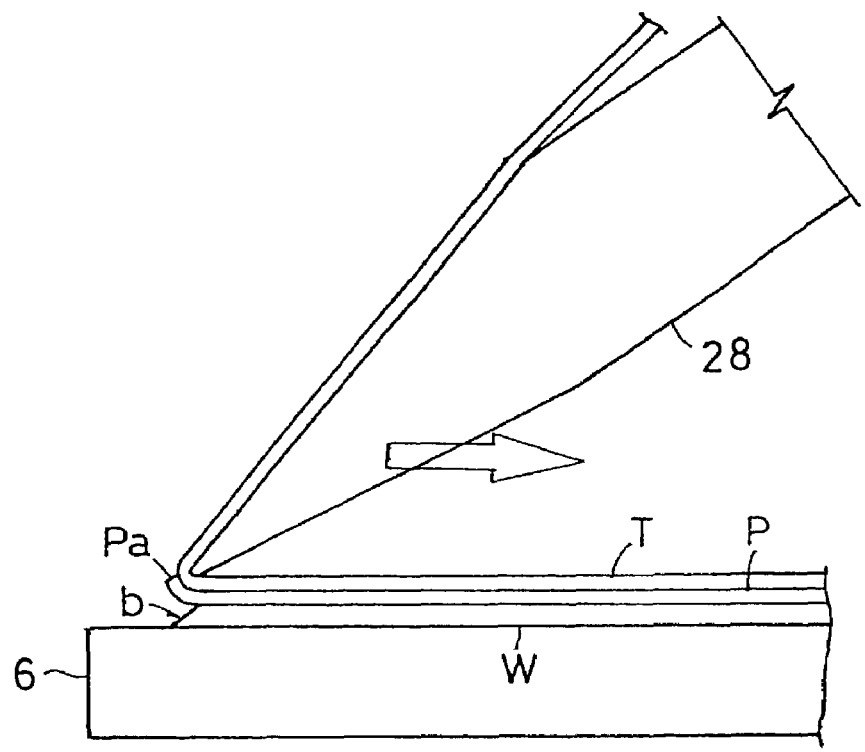
FIG. 14 is an enlarged front view of the principal portion of the tape peeling process.
Figure 15:
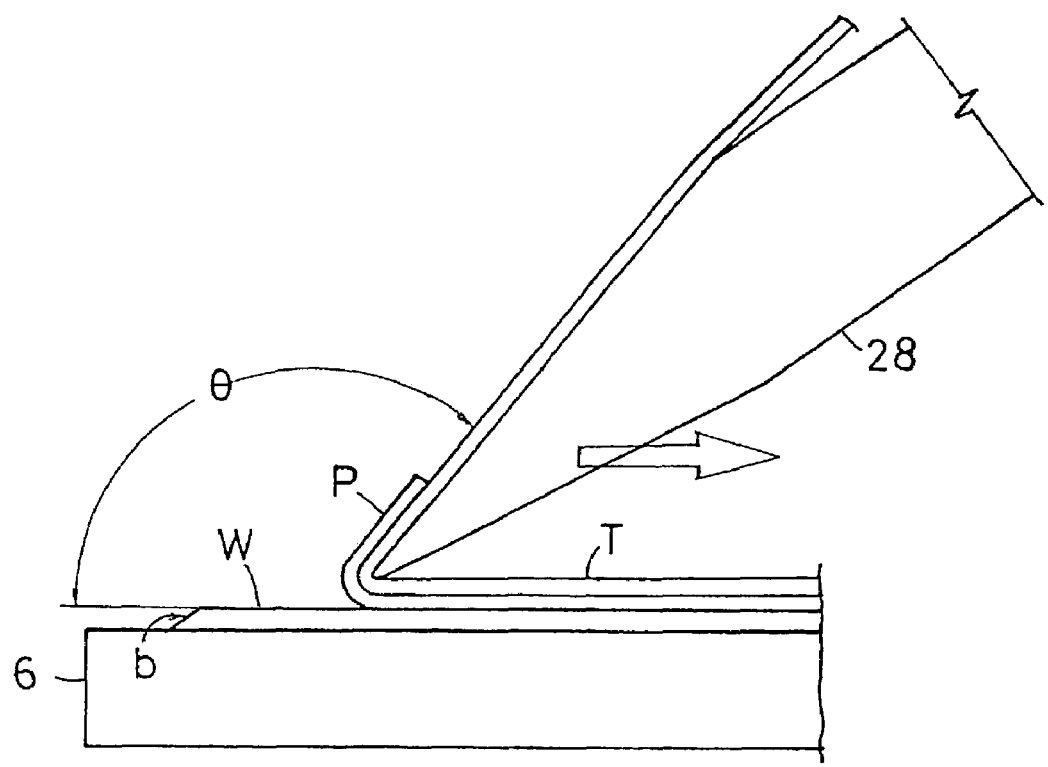
FIG. 15 is an enlarged front view of the principal portion of the tape peeling process.

Thus, when the edge member 28 moving forward rides on the end of wafer W, as shown in FIG. 14, the protruding end Pa of protective tape P adhering to the beveling b is reliably peeled from the beveling b. A subsequent peeling process is performed smoothly as shown in FIG. 15.

It is desirable that the tape folding angle θ provided by the edge member 28 is set to an acute angle of 90 degrees or more, preferably 100 degrees or more. However, this angle may be less than 90 degrees (close to 90 degrees) depending on the adhesion or tenacity or the strength of wafer W. Preferably, the more tenacious the protective tape P is, the smaller is the tape folding angle θ. This adjustment may be done by adjusting the extension of connecting rod 37 to adjust the angle of edge member 28 in the lower limit position. Variations in the height of edge member 28 occurring with variations in the angle of edge member 28 may be corrected by adjusting the mounting position of edge member 28 relative to the rotary support shaft 32.

<Second Embodiment>

A second embodiment will be described next with reference to the drawings.

Figure 16:
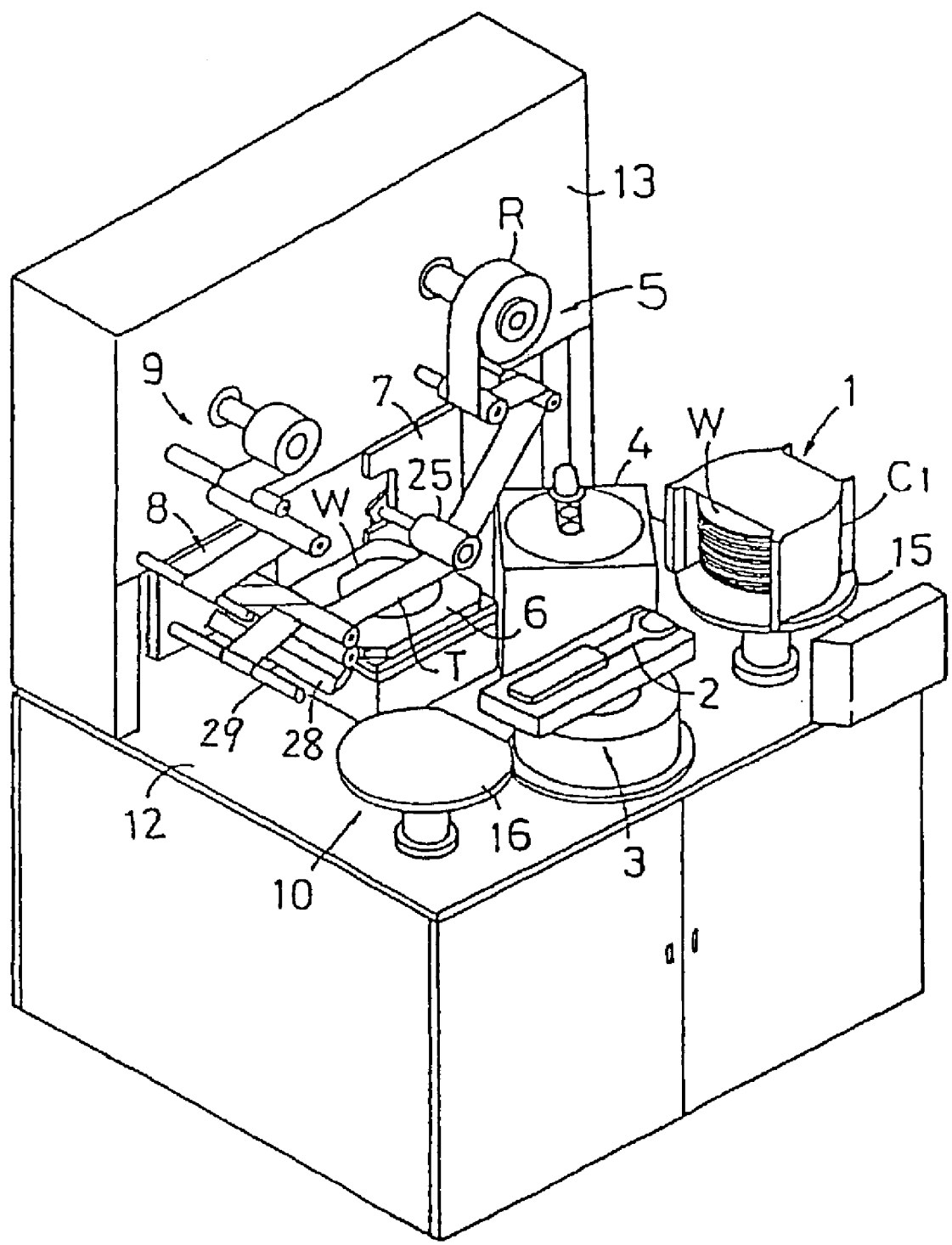
FIG. 16 is a perspective view showing an entire protective tape peeling apparatus in a second embodiment.
Figure 17:
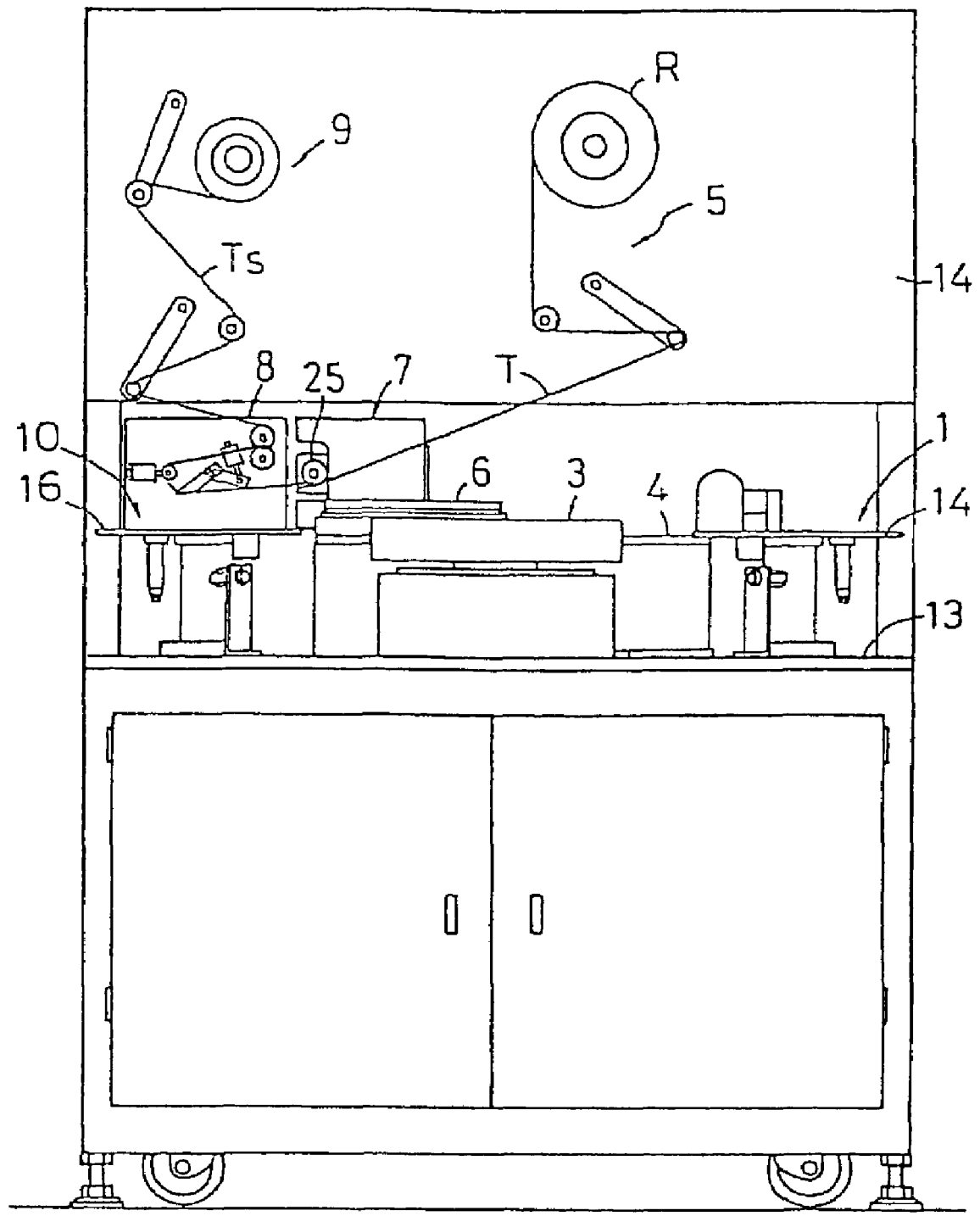
FIG. 17 is a front view of the entire protective tape peeling apparatus in the second embodiment.
Figure 18:
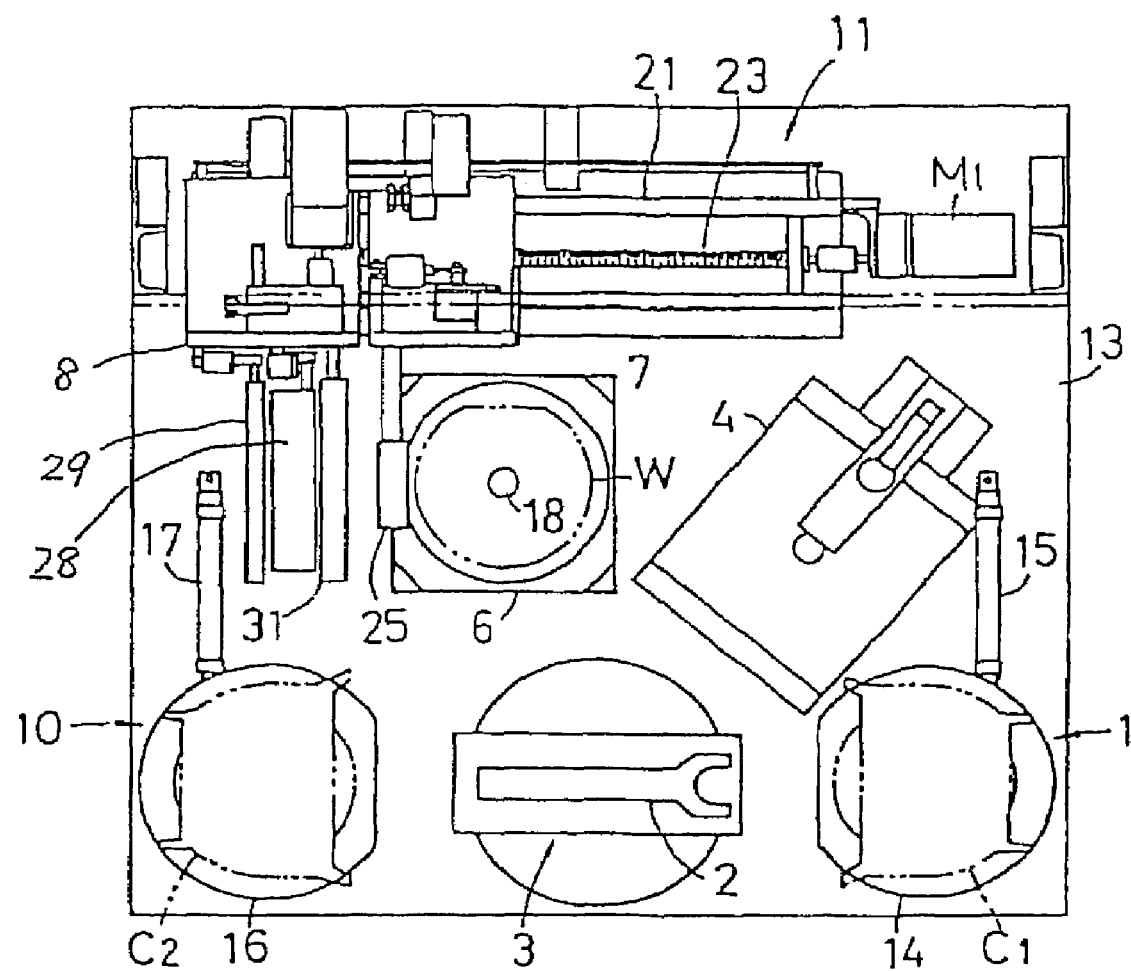
FIG. 18 is a plan view of the entire protective tape peeling apparatus in the second embodiment.
Figure 19:
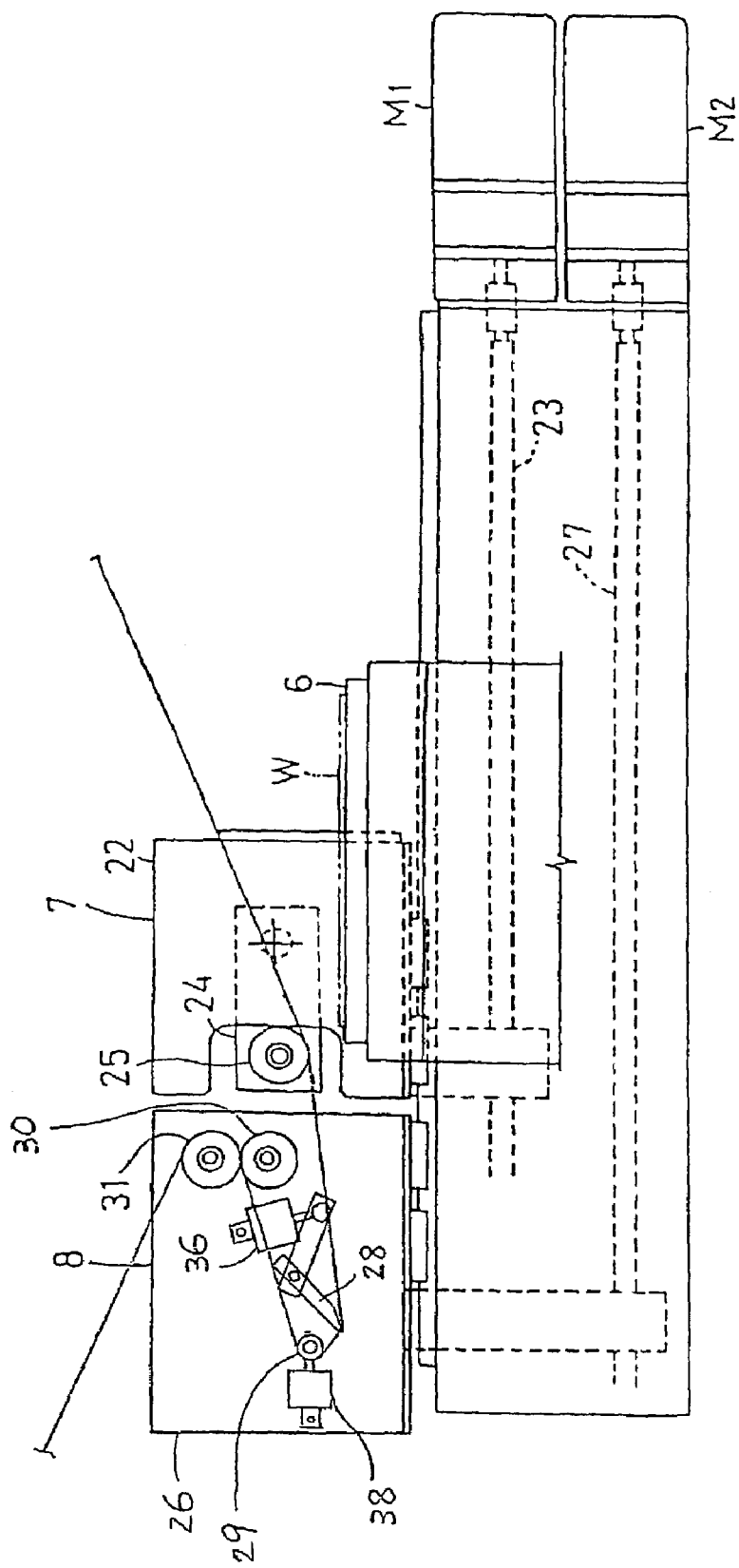
FIG. 19 is a front view of a tape applicator unit and a tape peeling unit.
Figure 20:
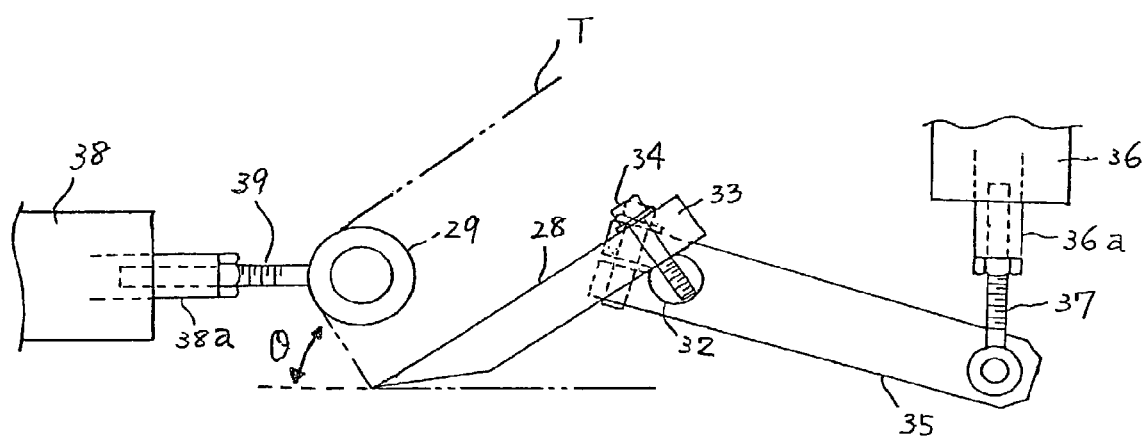
FIG. 20 is a front view showing a support structure for a tape peeling edge member.
Figure 21:
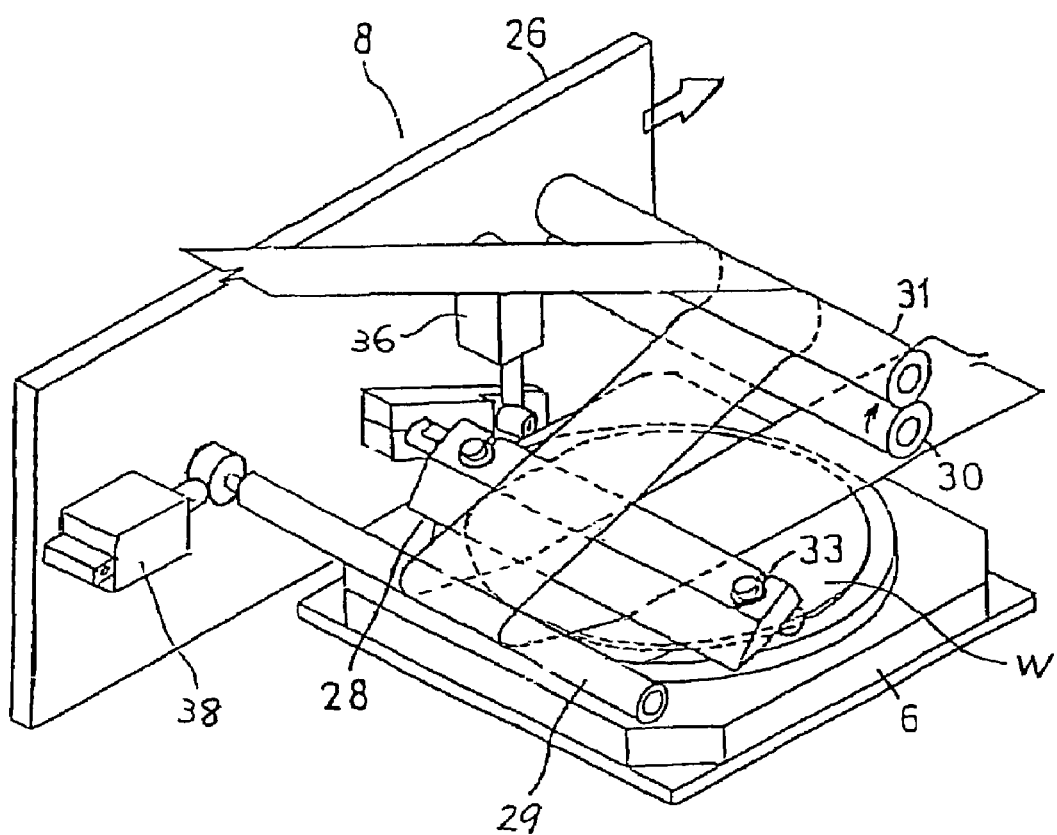
FIG. 21 is a perspective view of a principal portion showing a tape peeling operation.

FIG. 16 is a perspective view showing an entire protective tape peeling apparatus which is one example of unwanted substance removing apparatus according to this invention. FIG. 17 is a front view, and FIG. 18 is a plan view thereof. FIG. 19 is a front view of a tape applicator unit and a tape-peeling unit. FIG. 20 is a front view showing a support structure for a tape peeling edge member. FIG. 21 is a perspective view of a principal portion showing a tape peeling operation.

This embodiment differs from the first embodiment only in the tape-peeling unit 8. Parts identical to those of the first embodiment are shown with the same reference numerals, and are not described again.

The tape-peeling unit 8 includes a movable frame 26 reciprocable right and left through a fixed stroke along rails 21. This movable frame 26 has a tape peeling edge member 28, an angle adjusting roller 29a, a driven discharge roller 30 and a pinch roller 31 opposed thereto.

As shown in FIGS. 20 and 21, the tape peeling edge member 28 is formed of a plate defining a sharp edge at a distal end thereof and having a width greater than the diameter of the wafer. The edge member 28 is fixedly connected to a rotary support shaft 32 supported by and projecting from a front surface of movable frame 26. The edge member 28 is connected through slits 33 and bolts 34 to be adjustable as to its extension and retraction relative to the shaft 32.

A control arm 35 is fastened to a proximal end of rotary support shaft 32. The control arm 35 has a free end thereof pivotally connected to a connecting rod 37 which is connected to a piston rod 36a of an air cylinder 36 mounted on the front surface of movable frame 26. The piston rod 36a is extendible and retractable to swing the control arm 35 which in turn rotates the rotary support shaft 32, thereby to move the edge of edge member 28 vertically.

The connecting rod 37 extending from the free end of control arm 35 is screwed into the piston rod 36a of air cylinder 36. By adjusting a length of screw engagement of connecting rod 37, an adjustment may be made of a swing angle of control arm 35 occurring when the piston rod 36a is extended to its stroke end, i.e. an angle of edge member 28 in a lower limit position.

The angle adjusting roller 29a is a rotatable roller connected to a connecting rod 39 screwed into a piston rod 38a of an air cylinder 38 for rigid connection. That is, the position of angle adjusting roller 29a may be adjusted as desired by adjusting an amount of screw engagement of the connecting rod 39, thereby to adjust the tape folding angle θ.

Preferably, the more tenacious the protective tape P is, or the more tenacious the peeling tape T is, the smaller is the tape folding angle θ set by the angle adjusting roller 29a.

Figure 22:
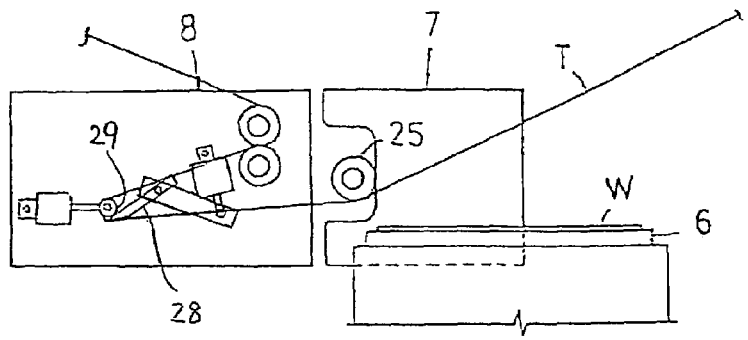
FIG. 22 is a front view illustrating a tape peeling process.

Next, a basic procedure for peeling the protective tape P from the surface of wafer W will be described with reference to FIGS. 22 through 26. The procedure up to loading the peeling table 6 with a wafer W is the same as in the first embodiment. Thus, the procedure will be described, starting with the wafer W having been placed on the peeling table 6 as shown in FIG. 22.

Figure 23:
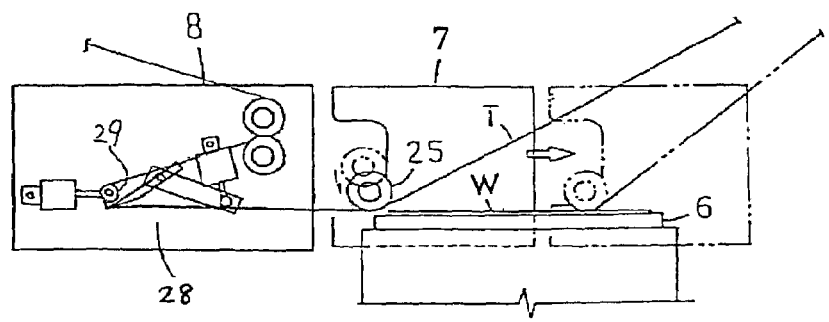
FIG. 23 is a front view illustrating the tape peeling process.

When the wafer W has been loaded on the peeling table 6, as shown in FIG. 23, the applicator roller 25 of tape applicator unit 7 is lowered to a predetermined level. Thereafter the entire unit is moved forward with the applicator roller 25 rolling over the wafer W to apply the peeling tape T to the surface of protective tape P.

Figure 24:
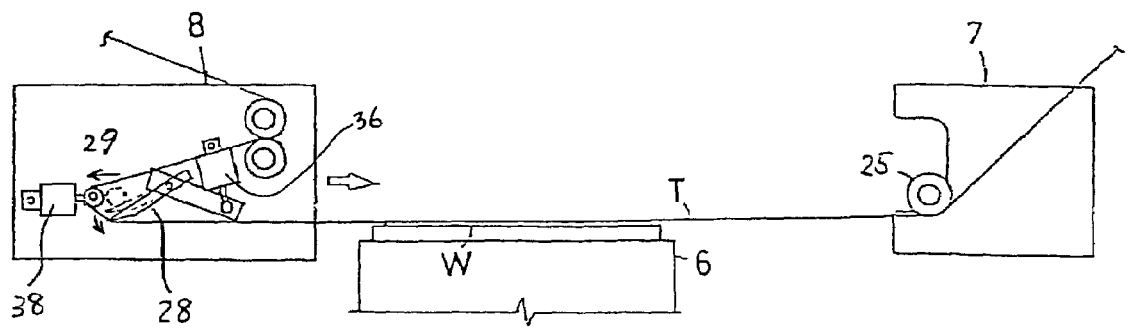
FIG. 24 is a front view illustrating the tape peeling process.

When the peeling tape T has been applied, as shown in FIG. 24, the air cylinder 36 of tape peeling unit 8 is extended to the stroke end to swing the control arm 35, thereby lowering the edge member 28 to the lower limit position. At the same time, the air cylinder 38 is contracted to the stroke end, whereby the angle adjustment roller 29 sets an angle θ. In this embodiment, the angle θ is set to an obtuse angle of 90 degrees or less.

Figure 25:
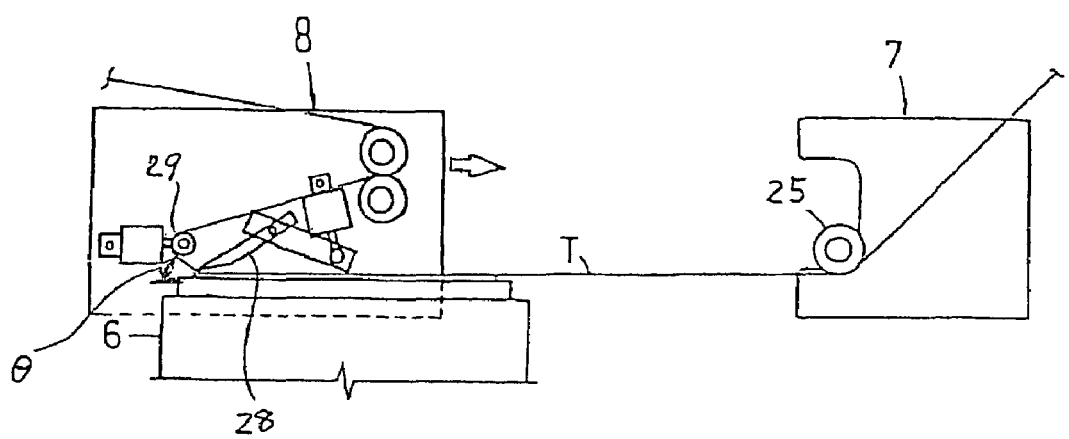
FIG. 25 is a front view illustrating the tape peeling process.

Next, as shown in FIG. 25, the tape-peeling unit 8 is moved forward, with the sharp end of edge member 28 pressing the peeling tape T upon the surface of protective tape P. At the same time, the discharge roller 30 is rotated at a peripheral speed synchronized with a moving speed of the unit to transport the peeling tape T. Thus, the peeling tape T is folded back by the angle θ at the angle adjusting roller 29a and guided through the guide roller 29 to a position between the discharge roller 30 and pinch roller 31. As shown in FIG. 21, the peeling tape T runs with the protective tape P fixedly adhering thereto, thereby peeling the protective tape P from the surface of wafer W.

In this case, the edge member 28 is set to a low forward speed when moving past an end of wafer W to start peeling the protective tape P therefrom. The forward moving speed is thereafter increased for improved processing efficiency. The discharge roller 30 is driven by a driving device not shown, through a slip clutch that slips under a load exceeding a predetermined torque. Thus, the peeling tape T is discharged with a predetermined tension applied thereto.

Figure 26:
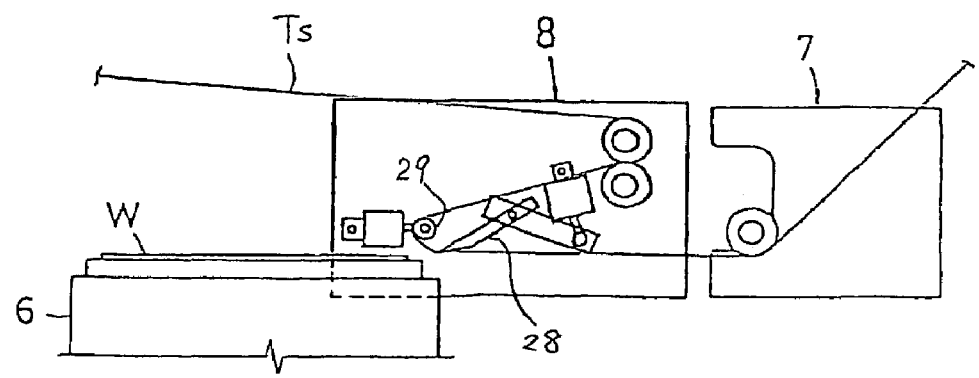
FIG. 26 is a front view illustrating the tape peeling process.

When the tape-peeling unit 8 has moved past the wafer W and peeled the protective tape P completely therefrom, as shown in FIG. 26, the robot arm 2 removes the wafer W from the peeling table 6, and inserts it into the cassette C2 at the wafer collecting station 10. Subsequently, the tape applicator unit 7 and tape-peeling unit 8 are retracted to the initial standby positions, while the used peeling tape Ts is wound up and collected. The applicator roller 25 and edge member 28 also are returned upward to the respective standby positions.

The above completes one tape peeling procedure, and the apparatus stands by to process a next wafer.

<Third Embodiment>

A third embodiment will be described next with reference to the drawings.

Figure 27:
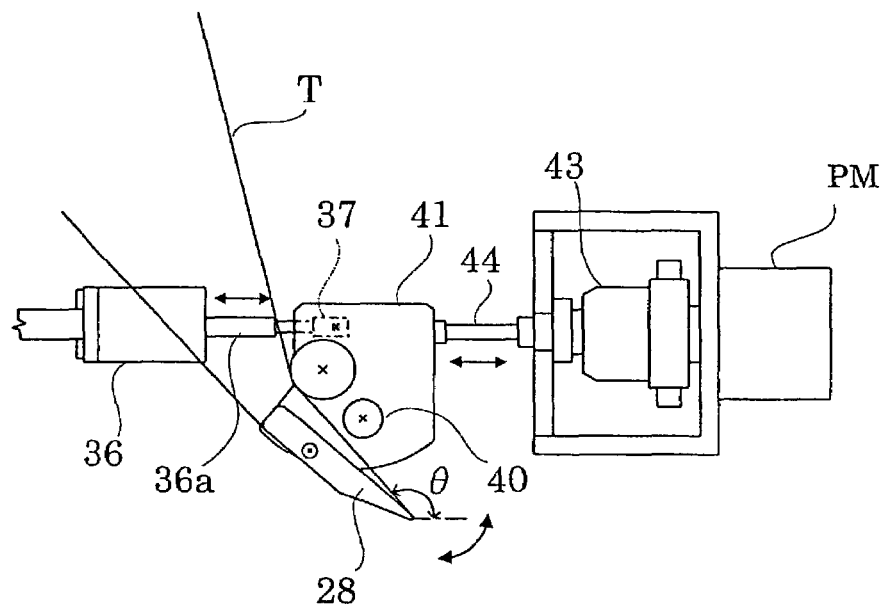
FIG. 27 is a front view showing a principal portion of a tape-peeling unit of an apparatus in a third embodiment.
Figure 28:
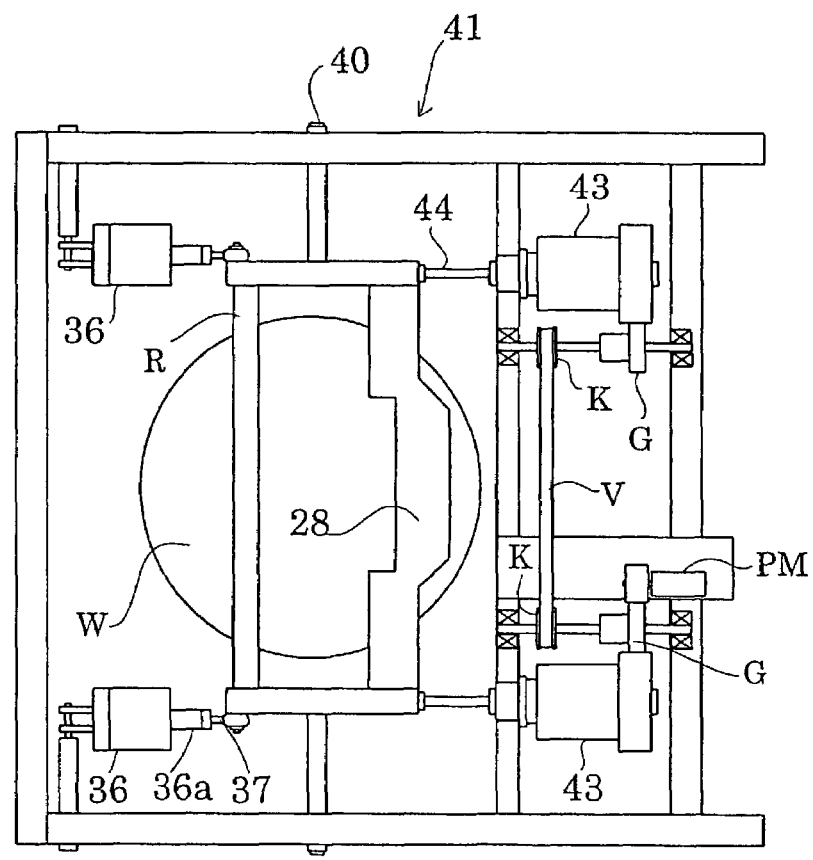
FIG. 28 is a plan view showing a principal portion showing a tape peeling operation of the apparatus in the third embodiment.

FIG. 27 is a front view showing a principal portion of a tape-peeling unit. FIG. 28 is a plan view of the principal portion of the tape-peeling unit.

This embodiment differs from the first embodiment only in the tape-peeling unit 8. Parts identical to those of the first embodiment are shown with the same reference numerals, and are not described again.

As shown in FIG. 27, the tape peeling edge member 28 is formed of a plate defining a sharp edge at a distal end thereof and having a width greater than the diameter of the wafer. The edge member 28 is attached to an edge unit 41 supported by a rotary shaft 40 of the tape-peeling unit 8. A peeling tape transport roller R is also mounted.

The edge unit 41 has a piston rod 36a of an air cylinder 36 connected to each side thereof through a connecting rod 37. With an extension and retraction of the piston rods 36a, the edge unit 41 is swung forward and backward in the direction of movement of edge member 28. As a result, the edge of edge member 28 is moved vertically to vary its angle as well as its height. The air cylinders 36, piston rods 36a and connecting rods 37 in this embodiment constitute the angle adjusting device of this invention.

Torque drive of a pulse motor PM is transmitted to the end of edge unit 41 remote from the air cylinders 36. The edge unit 41 has two micrometers 43 attached to the right and left sides thereof, with adjusting rods 44 extendible and retractable in response to reversed rotations of pulse motor PM.

Specifically, as shown in FIG. 28, the two micrometers 43 receive torque drive of an equal rotating rate from the single pulse motor PM through a belt V wound on pulleys K coaxial with gears G. That is, rotation of pulse motor PM is transmitted directly to one gear G and then to one micrometer 43. The rotation is transmitted to the other gear G indirectly through the belt V, and then to the other micrometer 43. The adjusting rods 44 of right and left micrometers 43 are extendible and retractable by the same scale.

The tip ends of adjusting rods 44 of micrometers 43 abut on the sides of the frame of edge unit 41. The edge unit 41 is tilted by the piston rods 36a to a predetermined angle. The adjusting rods 44 abutting on the frame of edge unit 41 act as stoppers for preventing the edge unit 8 from tilting in excess of the predetermined angle to move the edge vertically, particularly downward. By fixing the position of edge unit 41 as above, the following inconvenience is avoided.

Figure 29:
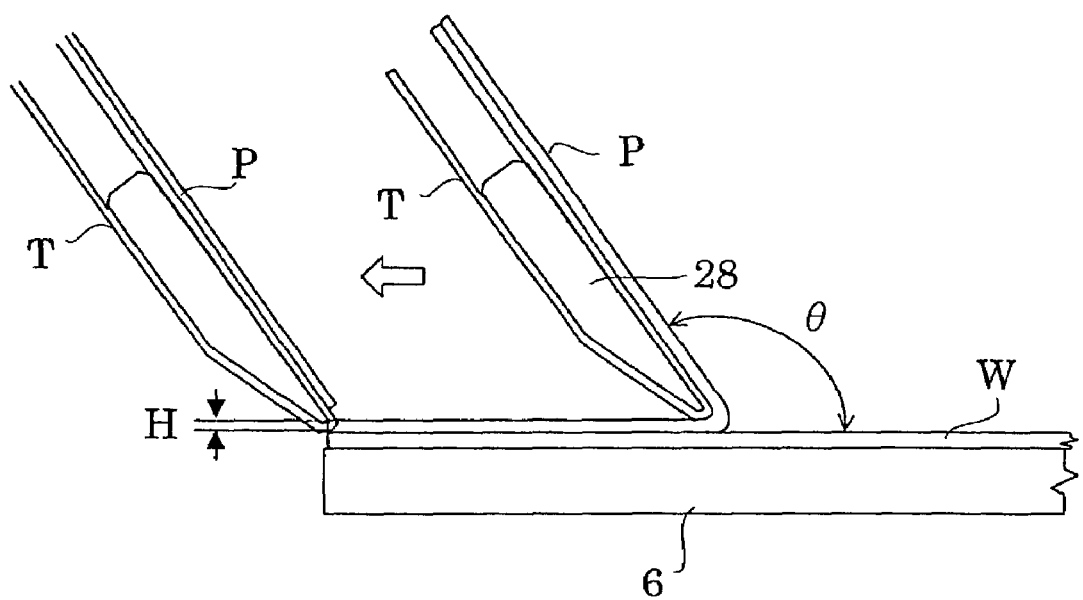
FIG. 29 is a front view showing a principal portion of the tape peeling operation.
Figure 30:
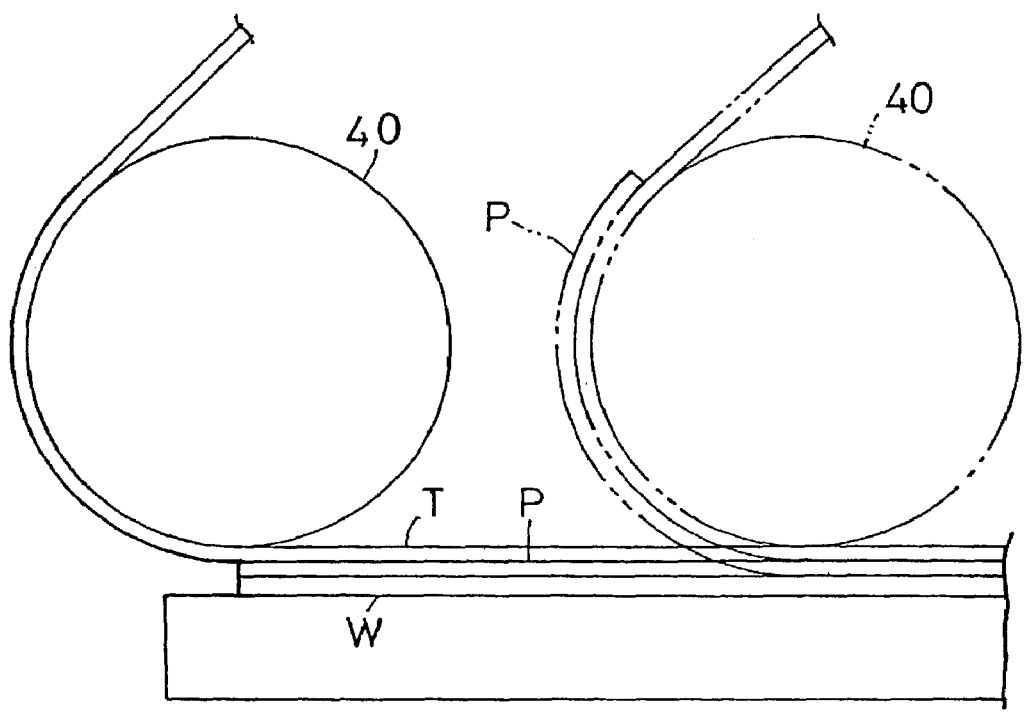
FIG. 30 is an enlarged front view of a principal portion of a tape peeling process by a conventional device.
Figure 31:
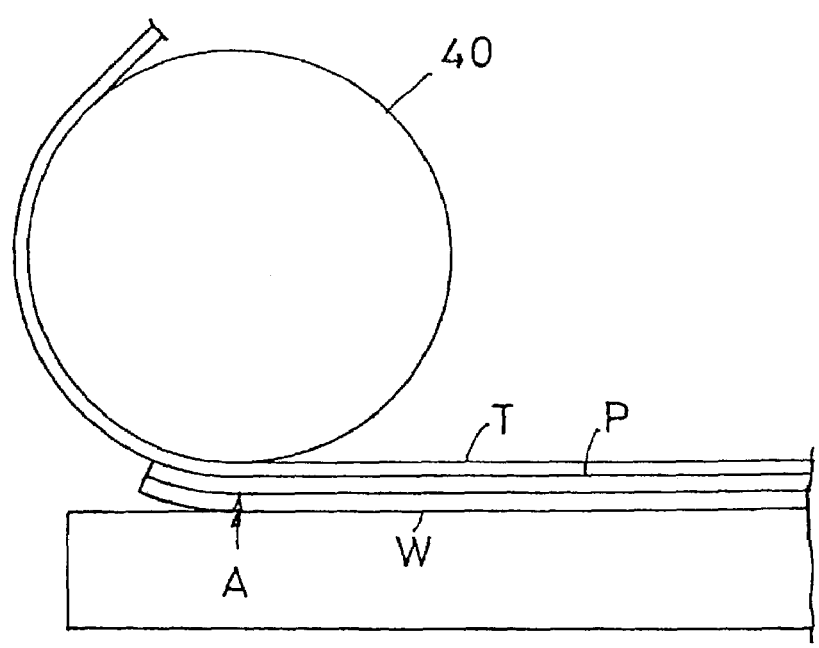
FIG. 31 is an enlarged front view of the principal portion of the tape peeling process by the conventional device.

In a peeling operation with the edge contacting the surface of peeling tape T, the edge presses by the peeling tape T. When the edge having reached an end of wafer W moves past the end, without fixing the position of edge unit 41, the edge would, as shown in FIG. 29, dip to a considerable extent, i.e. by a distance H into contact with the wafer W. By this phenomenon, the sticking surface of peeling tape T following the peel of protective tape P would adhere to the end of wafer W again. When the peeling unit 8 returns in this state, the end of wafer W would be curved up, which could result in damage.

The above inconvenience is avoided in this embodiment since the edge unit 41 is fixed by the adjusting rod 44 against vertical movement.

The peeling angle of edge unit 41, i.e. the tip position of the edge, is varied as appropriate, according to the thickness of protective tape P applied to the wafer W and the thickness of peeling tape T. The adjusting rods 44 need not keep in contact with the edge unit 41, but may be given play (a gap) according to the thickness of the two tapes, to an extent of preventing the peeling tape T from adhering to the surface of wafer W. The micrometers 43 correspond to the holding device of this invention.

An operation to peel the protective tape is the same as in the preceding embodiments, and will not be described again.

This invention is not limited to the above embodiments, but may be modified as follows:

(1) Upon reaching an end of wafer W, the edge member 28 may be reciprocated back and forth through a predetermined small stroke. Then, the peeling tape T may be applied to an end of protective tape P with increased reliability, and a subsequent integrated peel may be carried out effectively. This will be particularly effective when processing wafers W defining beveling b.

(2) Application of the peeling tape T to the protective tape P at an end of wafer W may be monitored with a CCD camera or the like. A predetermined peeling operation may be initiated after confirming that the peeing tape T has been applied to the end of protective tape P.

(3) The invention is applicable also to a case of peeling protective tape P with an adhesive tape from a wafer W supported by a ring frame.

(4) This invention is applicable also to a case of applying a peeling tape directly to the surface of a wafer to remove unwanted resist layer (unwanted substance) remaining on the surface of the wafer.

(5) The holding device for stabilizing the height of the edge of edge member 28 in the third embodiment is not limited to the micrometers 43. The device may have any other construction for preventing the peeling tape T from adhering directly to the wafer W during the series of operations to peel the peeling tape T from the wafer W.

(6) The tape-peeling unit 8 of the third embodiment adjusts the height and angle of the edge of edge member 28 by swinging the edge unit 41. This construction is not limitative. Only the edge member 28 may be adjusted independently to vary the angle, for example.

INDUSTRIAL UTILITY

The apparatus for removing unwanted substances from semiconductor wafer according to this invention, as described hereinbefore, is suited for peeling and removing the unwanted substances from the wafer by using a peeling tape, without the wafer being broken or damaged by the peeling force of the tape.

What is claimed is:

1. An apparatus for removing an unwanted substance from a semiconductor wafer, comprising:
    a peeling table for supporting the semiconductor wafer;
    a tape server for supplying a peeling tape to the semiconductor wafer on the peeling table;
    a tape applicator unit for receiving the peeling tape and applying the peeling tape to the semiconductor wafer;
    a tape peeling unit having an edge member for pressing, with a tip thereof, the peeling tape onto the unwanted substance, and peeling the peeling tape from the semiconductor wafer, starting at an end of the semiconductor wafer, by folding back the peeling tape at a tilt angle given by the tip of the edge member to the peeling tape; and
    a tape collector for collecting the peeling tape peeled along with the unwanted substance from the wafer.

2. An apparatus for removing an unwanted substance as defined in claim 1, characterized in that said tape-peeling unit has means for adjusting an angle of said edge member to the surface of the wafer.

3. An apparatus for removing an unwanted substance as defined in claim 1, characterized in that said tape peeling unit has holding means for preventing the tip of the edge member from falling when the tip of the edge member peeling the peeling tape from the wafer moves beyond a terminal end of the wafer.

4. An apparatus for removing an unwanted substance as defined in claim 1, characterized in that said tape-peeling unit includes:
    an edge unit having an edge member attached thereto, and supported to be swingable back and forth in a direction of movement of the tape-peeling unit;
    angle adjusting means for adjusting an angle of said edge member to the surface of the wafer; and
    holding means for preventing the tip of the edge member from falling when the tip of the edge member peeling the peeling tape from the wafer moves beyond a terminal end of the wafer;
    said angle adjusting means having a member for swinging said edge unit to adjust an angle of the tip of the edge member; and
    said holding means having a member for restricting vertical movement of the tip of the edge member occurring with swinging of said edge unit.

5. An apparatus for removing an unwanted substance as defined in claim 1, characterized in that the peeling angle given to the peeling tape by the tip of said edge member is an acute angle.

6. An apparatus for removing an unwanted substance as defined in claim 5, characterized in that the tape folding angle at the tip of the edge member is at least 90 degrees.

7. An apparatus for removing an unwanted substance as defined in claim 1, characterized in that the peeling angle given to the peeling tape by the tip of said edge member is an obtuse angle.

8. An apparatus for removing an unwanted substance as defined in claim 7, characterized in that the tape folding angle at the tip of the edge member is less than 90 degrees.

9. An apparatus for removing an unwanted substance as defined in claim 4, characterized in that said holding means comprises micrometers.

10. An apparatus for removing an unwanted substance from a semiconductor wafer, comprising:
    a peeling table for supporting the semiconductor wafer;
    a tape server for supplying a peeling tape to the semiconductor wafer on the peeling table;
    a tape applicator unit for receiving the peeling tape and applying the peeling tape to the semiconductor wafer;
    a tape peeling unit having an edge member for peeling the peeling tape from the semiconductor wafer, starting at an end of the semiconductor wafer, by folding back the peeling tape at a peeling angle given by the tip of the edge member to the peeling tape;
    a tape collector for collecting the peeling tape peeled along with the unwanted substance from the wafer; and
    means for reciprocating the tip of said edge member through a small stroke at the end of the wafer.

* * * * *